(12) United States Patent
Kim et al.

(10) Patent No.: US 11,538,896 B2
(45) Date of Patent: Dec. 27, 2022

(54) DISPLAY DEVICE

(71) Applicant: Samsung Display Co., Ltd., Yongin-si (KR)

(72) Inventors: Wontae Kim, Hwaseong-si (KR); Jae-Han Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/149,573

(22) Filed: Jan. 14, 2021

(65) Prior Publication Data

US 2022/0013613 A1     Jan. 13, 2022

(30) Foreign Application Priority Data

Jul. 10, 2020   (KR) .................. 10-2020-0085296

(51) Int. Cl.
*H05K 1/18*     (2006.01)
*H05K 1/11*     (2006.01)
(Continued)

(52) U.S. Cl.
CPC .......... *H01L 27/3276* (2013.01); *H01L 24/08* (2013.01); *H01L 24/09* (2013.01);
(Continued)

(58) Field of Classification Search
CPC ........ H05K 1/189; H05K 1/118; H05K 1/147; H05K 1/14; H05K 1/02; H05K 1/111; H05K 1/117; H05K 2201/09027; H05K 2201/10128; H05K 2201/041; H05K 2201/049; H05K 2201/09409;
(Continued)

(56) References Cited

U.S. PATENT DOCUMENTS

| | | | |
|---|---|---|---|
| 7,557,451 B2 * | 7/2009 | Shinojima | G02F 1/13452 438/149 |
| 2014/0369009 A1 * | 12/2014 | Cho | G02F 1/13452 361/749 |

(Continued)

FOREIGN PATENT DOCUMENTS

| | | |
|---|---|---|
| CN | 107770957 A | 3/2018 |
| JP | 3760661 B2 | 3/2006 |

(Continued)

*Primary Examiner* — Roshn K Varghese
(74) *Attorney, Agent, or Firm* — Lewis Roca Rothgerber Christie LLP

(57) ABSTRACT

A display device includes: a display panel including first pads arranged along a first direction, and second pads spaced apart from the first pads; a first connection circuit board electrically connected to the first pads; and a second connection circuit board electrically connected to the second pads. The first connection circuit board includes: first output pads electrically connected to the first pads; and at least two first protrusion parts spaced along the first direction and protruding in a second direction crossing the first direction. The second connection circuit board includes: second output pads electrically connected to the second pads; and at least one second protrusion part protruding in the second direction, and located between the first protrusion parts when viewed on a plane that is parallel to a surface of the display panel.

19 Claims, 12 Drawing Sheets

(51) Int. Cl.
*H01L 27/32* (2006.01)
*H01L 25/18* (2006.01)
*H01L 23/00* (2006.01)

(52) U.S. Cl.
CPC ............ *H01L 24/32* (2013.01); *H01L 24/33* (2013.01); *H01L 25/18* (2013.01); *H05K 1/118* (2013.01); *H05K 1/189* (2013.01); *H01L 2224/08225* (2013.01); *H01L 2224/0903* (2013.01); *H01L 2224/32227* (2013.01); *H01L 2224/3303* (2013.01); *H05K 2201/09027* (2013.01); *H05K 2201/10128* (2013.01)

(58) Field of Classification Search
CPC ............ H05K 3/323; H05K 2201/052; H05K 2201/053; G02F 1/13452; G02F 1/13458; H01L 27/3276; H01L 27/32; H01L 24/08; H01L 24/09; H01L 24/32; H01L 24/33; H01L 25/18; H01L 2224/08225; H01L 2224/0903; H01L 2224/32227; H01L 2224/3303; H01L 51/5284; H01L 51/52; H01L 27/3246; H01R 12/62; G09G 3/3208

See application file for complete search history.

(56) References Cited

U.S. PATENT DOCUMENTS

| | | | |
|---|---|---|---|
| 2016/0219706 A1* | 7/2016 | Jo | ............... H05K 1/118 |
| 2018/0068992 A1* | 3/2018 | Oh | ............... H01L 24/00 |
| 2018/0069067 A1* | 3/2018 | Oh | ............... H05K 1/147 |
| 2020/0077518 A1 | 3/2020 | Kim et al. | |

FOREIGN PATENT DOCUMENTS

| | | |
|---|---|---|
| KR | 10-2020-0026369 A | 3/2020 |
| KR | 10-2020-0115877 A | 10/2020 |

* cited by examiner

DISPLAY DEVICE

CROSS-REFERENCE TO RELATED APPLICATION

This application claims priority to and the benefit of Korean Patent Application No. 10-2020-0085296, filed on Jul. 10, 2020, the entire content of which is incorporated by reference herein.

BACKGROUND

Aspects of example embodiments of the present disclosure relate to a display device, and more particularly, to a display device with improved display efficiency and durability.

In general, after a display panel is manufactured, a circuit board is connected to the display panel. For example, in the Tape Automated Bonding (TAB) mounting method, a circuit board is bonded to the display panel by using an anisotropic conductive film (ACF).

Recently, while a bezel area (or a non-display area) is reduced, design proposals for a display device having strong durability have been actively studied.

The above information disclosed in this Background section is for enhancement of understanding of the background of the present disclosure, and therefore, it may contain information that does not constitute prior art.

SUMMARY

One or more example embodiments of the present disclosure are directed to a display device including a connection circuit board that may be applied to a high-resolution display device, while reducing an inefficient area and preventing or substantially preventing defects such as curling and tearing from occurring.

According to one or more example embodiments of the present disclosure, a display device includes: a display panel including first pads arranged along a first direction, and second pads spaced apart from the first pads; a first connection circuit board electrically connected to the first pads; and a second connection circuit board electrically connected to the second pads. The first connection circuit board includes: first output pads electrically connected to the first pads; and at least two first protrusion parts spaced along the first direction and protruding in a second direction crossing the first direction. The second connection circuit board includes: second output pads electrically connected to the second pads; and at least one second protrusion part protruding in the second direction, and located between the first protrusion parts when viewed on a plane that is parallel to a surface of the display panel.

In an example embodiment, the display device may further include a main circuit board electrically connected to the first connection circuit board and the second connection circuit board.

In an example embodiment, the first connection circuit board may further include first input pads on each of the first protrusion parts and electrically connected to the main circuit board, and the second connection circuit board may further include second input pads on the second protrusion part and electrically connected to the main circuit board.

In an example embodiment, the first protrusion parts may not overlap with the second protrusion part when viewed on the plane.

In an example embodiment, the first protrusion parts may be symmetrical to each other relative to a first reference line extending through a center of the first connection circuit board in a direction perpendicular to the first direction.

In an example embodiment, the first connection circuit board may further include a plurality of first signal lines electrically connected to the first output pads, and the plurality of first signal lines may have a symmetrical shape relative to the first reference line.

In an example embodiment, the second protrusion part may have a symmetrical shape relative to a second reference line extending through a center of the second connection circuit board in a direction perpendicular to the first direction.

In an example embodiment, the second connection circuit board may further include a plurality of second signal lines electrically connected to the second output pads, and the plurality of second signal lines may have a symmetrical shape relative to the second reference line.

In an example embodiment, the second connection circuit board may further include a hatched portion extending in a direction between the first direction and the second direction with the second protrusion part therebetween.

In an example embodiment, the first connection circuit board may further include at least one first additional protrusion part between the first protrusion parts and spaced apart from the first protrusion parts along the first direction.

In an example embodiment, the second protrusion part may include a plurality of second protrusion parts, and at least one second concave part may be defined between the plurality of second protrusion parts in the second connection circuit board.

In an example embodiment, the first connection circuit board may be on the second connection circuit board.

In an example embodiment, the second connection circuit board may be on the first connection circuit board.

In an example embodiment, a first concave part may be defined between the first protrusion parts, the first protrusion parts may include a first sub-protrusion part and a second sub-protrusion part spaced apart from the first sub-protrusion part along the first direction with the first concave part therebetween, and the first sub-protrusion part and the second sub-protrusion part may have the same shape as each other.

In an example embodiment, the first connection circuit board may further include a first driving circuit between the first output pads and the first protrusion parts, and the second connection circuit board may further include a second driving circuit between the second output pads and the second protrusion part.

In an example embodiment, the first driving circuit and the second driving circuit may not overlap with each other when viewed on the plane.

According to one or more example embodiments of the present disclosure, a display device includes: a display panel including first pads and second pads; a first connection circuit board electrically connected to the first pads; and a second connection circuit board electrically connected to the second pads. The first connection circuit board includes: a first connection part electrically connected to the first pads; and a first pattern part defining at least two first protrusion parts that are spaced apart along a first direction, and protrude along a second direction crossing the first direction. The second connection circuit board includes: a second connection part electrically connected to the second pads; and a second pattern part protruding along the second direction, and defining at least one second protrusion part that does not overlap with the first protrusion parts when viewed on a plane that is parallel to a surface of the display panel. The first protrusion parts have a symmetrical shape relative to a first reference line extending through a center of the first connection circuit board in a direction perpendicular to the first direction, and the second protrusion part has a symmetrical shape relative to a second reference line extending through a center of the second connection circuit board in a direction perpendicular to the first direction.

In an example embodiment, a first concave part may be defined between the first protrusion parts in the first pattern part, and the second protrusion part may overlap with the first concave part when viewed on the plane.

In an example embodiment, the display device may further include a main circuit board electrically connected to the first connection circuit board and the second connection circuit board, the first connection circuit board may further include first input pads on the first protrusion parts and electrically connected to the main circuit board, and the second connection circuit board further may further include second input pads on the second protrusion part and electrically connected to the main circuit board.

In an example embodiment, the first protrusion parts may include a first sub-protrusion part and a second sub-protrusion part spaced apart from the first sub-protrusion part along the first direction with a first concave part therebetween, and the first sub-protrusion part and the second sub-protrusion part may be symmetrical to each other relative to the first reference line.

BRIEF DESCRIPTION OF THE FIGURES

The above and other aspects and features of the present disclosure will become more apparent to those skilled in the art from the following detailed description of the example embodiments with reference to the accompanying drawings. In the drawings.

DETAILED DESCRIPTION

Figure 1A:
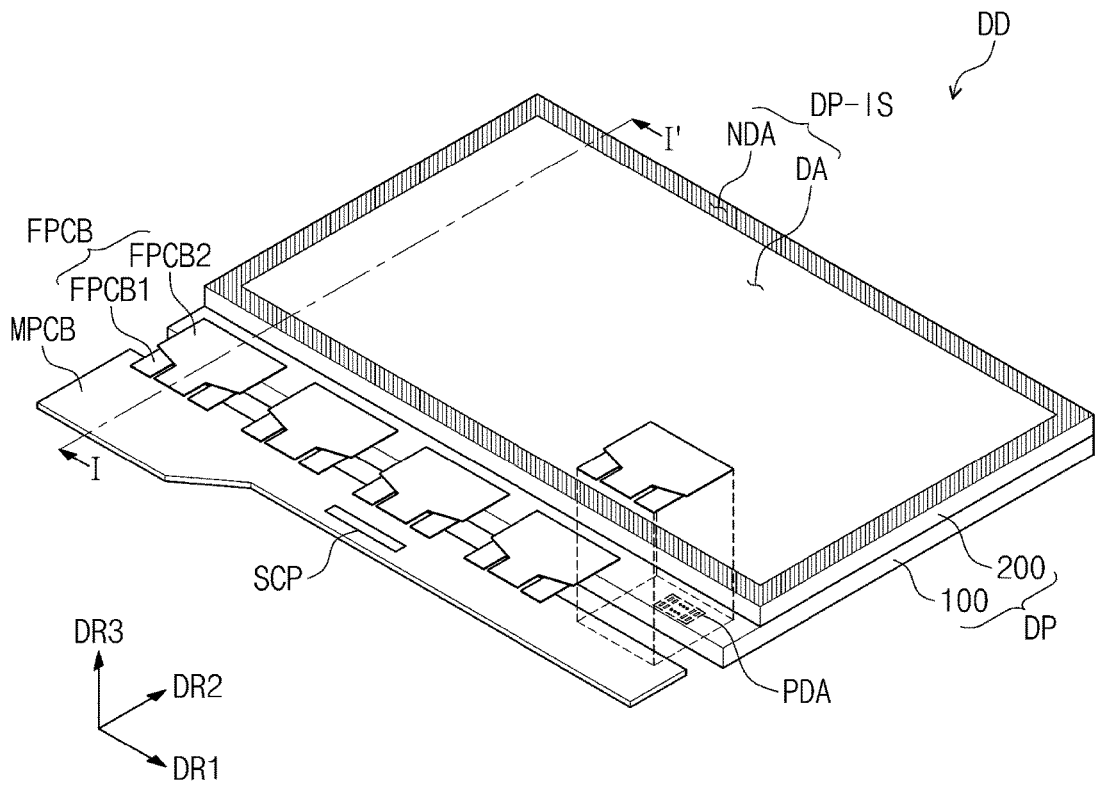
FIG. 1A is a perspective view of a display device according to an embodiment of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. In other words, these terms are described as a relative concept based on the directions shown in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
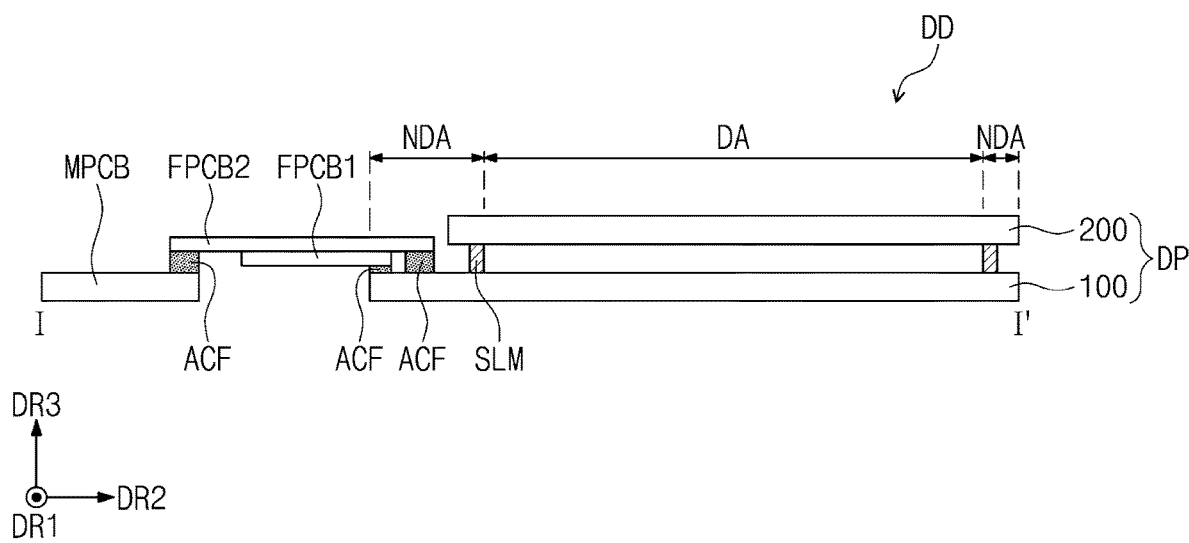
FIG. 1B is a cross-sectional view of a display device according to an embodiment of the present disclosure.
Figure 2:
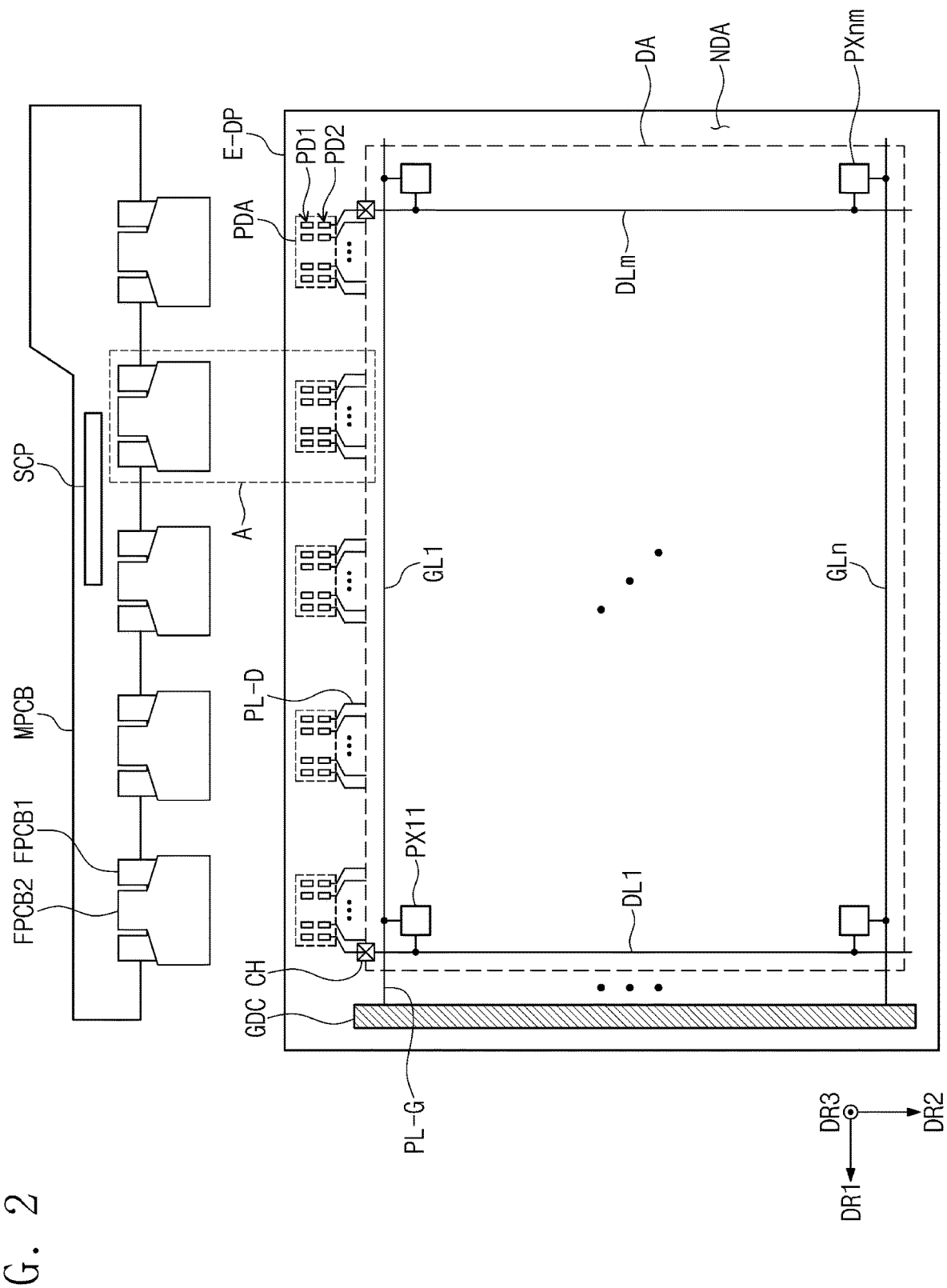
FIG. 2 is a plan view of a display device according to an embodiment of the present disclosure.

FIG. 1A is a perspective view of a display device according to an embodiment of the present disclosure. FIG. 1B is a cross-sectional view of a display device according to an embodiment of the present disclosure. For example, FIG. 1B shows a cross-section taken along the line I-I' of FIG. 1A. FIG. 2 is a plan view of a display device according to an embodiment of the present disclosure.

Referring to FIGS. 1A, 1B, and 2, a display device DD includes a display panel DP, a connection circuit board FPCB, and a main circuit board MPCB. In an embodiment, a driving circuit DC may be mounted on the connection circuit board FPCB, but the present disclosure is not limited thereto. For example, the driving circuit DC may not be mounted on the connection circuit board FPCB, and may be mounted on the display panel DP or the main circuit board MPCB. The connection circuit board FPCB may include a first connection circuit board FPCB1 and a second connection circuit board FPCB2. A driving circuit DC that is mounted on the first connection circuit board FPCB1 may be referred to as a first driving circuit, and a driving circuit DC that is mounted on the second connection circuit board FPCB2 may be referred to as a second driving circuit.

In some embodiments, the display device DD may further include a chassis member or a molding member, and may further include a backlight unit (e.g., a backlight) according to a type of the display panel DP.

The display panel DP may be any suitable one of a liquid crystal display panel, a plasma display panel, an electrophoretic display panel, a microelectromechanical system (MEMS) display panel, an electrowetting display panel, an organic light emitting display panel, and a quantum dot light emitting display panel, but is not particularly limited thereto. An emission layer of the organic light emitting display panel may include an organic light emitting material. An emission layer of the quantum dot light emitting display panel may include a quantum dot or a quantum rod. Hereinafter, for convenience of illustration and description, the display panel DP is described as being an organic light emitting display panel, but the present disclosure is not limited thereto, and the display panel DP may be any suitable type of display panel, for example, such as a liquid crystal display panel.

The display panel DP may include a first substrate 100, and a second substrate 200 facing and spaced apart from the first substrate 100. A cell gap may be formed between the first substrate 100 and the second substrate 200. The cell gap may be maintained by a sealant SLM that connects the first substrate 100 and the second substrate 200 to each other. A filling layer FL (e.g., see FIG. 3) formed of an insulating material or the like may be filled in the cell gap formed between the first substrate 100 and the second substrate 200. However, the present disclosure is not limited thereto, and an air layer may be disposed in the cell gap formed between the first substrate 100 and the second substrate 200. A gradation display layer for generating an image may be disposed between the first substrate 100 and the second substrate 200. The gradation display layer may include a liquid crystal layer, an organic emission layer, an electrophoretic layer, and/or a quantum dot emission layer, depending on the type of the display panel DP. However, the present disclosure is not limited thereto, and in some embodiments, one of the first substrate 100 or the second substrate 200 may be omitted, and the display panel DP may include one display substrate.

As shown in FIG. 1A, the display panel DP may display an image through a display surface DP-IS. The display surface DP-IS is parallel to or substantially parallel to a surface defined by the first direction DR1 and the second direction DR2. The display surface DP-IS may include a display area DA, and a non-display area NDA. The non-display area NDA is defined along an edge of the display surface DP-IS. The display area DA may be surrounded (e.g., around a periphery thereof) by the non-display area NDA. However, the present disclosure is not limited thereto, and in an embodiment of the present disclosure, the non-display area NDA may be adjacent to only one area of the display area DA that is adjacent to the connection circuit boards FPCB1 and FPCB2.

A third direction DR3 shown in the figures indicates the normal direction of the display surface DP-IS, for example, the thickness direction of the display panel DP. The front surface (or the upper surface) and the rear surface (or the lower surface) of each of the layers and/or units described in more detail below are divided by the third direction DR3. However, the first to third directions DR1, DR2, and DR3 illustrated in the figures are only examples, and the present disclosure is not limited thereto. As used in the present specification, the directions indicated by the first to third directions DR1, DR2, and DR3 may indicate various suitable directions that are parallel to or substantially parallel to each other, unless otherwise described.

In an embodiment of the present disclosure, the display panel DP having a flat or substantially flat display surface is illustrated, but the present disclosure is not limited thereto. For example, in other embodiments, the display device DD may include a curved display surface or a three-dimensional display surface. The three-dimensional display surface may include a plurality of display areas indicating (e.g., facing) different directions from each other.

A signal control unit (e.g., a signal controller) SCP may be mounted on the main circuit board MPCB. The signal control unit SCP receives image data and control signals from an external graphic control unit (e.g., an external graphics controller). The signal control unit SCP may provide a control signal to the display panel DP.

The connection circuit board FPCB is electrically connected to each of the display panel DP and the main circuit board MPCB. The connection circuit board FPCB may transmit a signal from the main circuit board MPCB to the driving circuit DC, and may transmit the signal from the driving circuit DC to the display panel DP. In the present embodiment, the driving circuit DC may be a data driving circuit. The driving circuit DC may be mounted on the connection circuit board FPCB, and may be mounted on each of the first and second connection circuit boards FPCB1 and FPCB2. A specific arrangement relationship of the driving circuit DC mounted on the connection circuit board FPCB will be described in more detail below.

In an embodiment of the present disclosure, the connection circuit board FPCB may transmit a signal from the signal control unit SCP to the display panel DP. The connection circuit board FPCB may include a base layer including a flexible material.

The connection circuit board FPCB may be connected to each of the display panel DP and the main circuit board MPCB by a conductive adhesive member. The conductive adhesive member may include an anisotropic conductive film ACF. Hereinafter, for convenience, the conductive adhesive member may be described as the anisotropic conductive film ACF.

In the present embodiment, the connection circuit board FPCB may include the two (e.g., two types of) connection circuit boards FPCB1 and FPCB2. The first and second connection circuit boards FPCB1 and FPCB2 are connected to different pad rows arranged at (e.g., in or on) one pad area PDA. In the present embodiment, the pad area PDA is shown to be disposed on the first substrate 100, but the present disclosure is not limited thereto. For example, in another embodiment of the present disclosure, the pad area PDA may be disposed on the second substrate 200. The two (e.g., the two types of) connection circuit boards FPCB1 and FPCB2 will be described in more detail below.

In FIG. 2, an arrangement relationship of panel signal lines GL1 to GLn, DL1 to DLm, PL-G, and PL-D, and pixels PX11 to PXnm on a plane is illustrated. The panel signal lines GL1 to GLn, DL1 to DLm, PL-G, and PL-D include a plurality of gate lines GL1 to GLn, a plurality of data lines DL1 to DLm, and auxiliary signal lines PL-G and PL-D.

The plurality of gate lines GL1 to GLn extend in the first direction DR1, and are arranged along the second direction DR2. The plurality of data lines DL1 to DLm are insulated from and cross the plurality of gate lines GL1 to GLn. The plurality of gate lines GL1 to GLn and the plurality of data lines DL1 to DLm are disposed at (e.g., in or on) the display area DA. The auxiliary signal lines PL-G and PL-D are disposed at (e.g., in or on) the non-display area NDA, and are connected to the plurality of gate lines GL1 to GLn and the plurality of data lines DL1 to DLm. The auxiliary signal lines PL-G and PL-D include gate auxiliary signal lines PL-G and data auxiliary signal lines PL-D.

The gate auxiliary signal lines PL-G are connected to the plurality of gate lines GL1 to GLn, and may be disposed at (e.g., in or on) the same layer as those of the plurality of gate lines GL1 to GLn to form an integral shape. In FIG. 2, the plurality of gate lines GL1 to GLn and the gate auxiliary signal lines PL-G are illustrated as the same signal lines. Each one of the gate lines GL1 to GLn and corresponding one of the gate auxiliary signal lines PL-G, which are connected to each other, may be defined as different portions of one signal line. However, the present disclosure is not limited thereto, and the gate lines GL1 to GLn and the gate auxiliary signal lines PL-G, which are connected to each other, may be defined as being separated from each other.

The data auxiliary signal lines PL-D are connected to the data lines DL1 to DLm, and may be disposed at (e.g., in or on) a different layer from those of the plurality of data lines DL1 to DLm. The data lines DL1 to DLm may be electrically connected to corresponding signal lines from among the data auxiliary signal lines PL-D through a contact hole CH. The contact hole CH penetrates at least one insulating layer disposed between the data lines DL1 to DLm and the data auxiliary signal lines PL-D. In FIG. 2, two contact holes CH are illustrated by way of example.

However, the present disclosure is not limited thereto, and an embodiment of the present disclosure, the contact hole CH may be omitted. In this case, the data lines DL1 to DLm and the data auxiliary signal lines PL-D may be disposed at (e.g., in or on) the same layer as each other, and the connected ones of the data lines DL1 to DLm and the data auxiliary signal lines PL-D from among the data lines DL1 to DLm and the data auxiliary signal lines PL-D may be defined as one signal line. In this case, the data line and the data auxiliary signal line, which are connected to each other, may be defined as different parts of the same signal line.

Each of the pixels PX11 to PXnm is connected to a corresponding gate line from among the plurality of gate lines GL1 to GLn and a corresponding data line from among the plurality of data lines DL1 to DLm. Each of the pixels PX11 to PXnm may include a pixel driving circuit and a display element.

The pixels PX11 to PXnm may be arranged in a matrix shape along each of the first direction DR1 and the second direction DR2. However, the present disclosure is not limited thereto, and the pixels PX11 to PXnm may be arranged in an RGBG structure (e.g., a PENTILE® shape, which is a duly registered trademark of Samsung Display Co., Ltd.). For example, the pixels PX11 to PXnm may be arranged in a diamond shape or a stripe shape.

As illustrated in FIG. 2, two pad rows PD1 and PD2 are disposed at (e.g., in or on) each of the pad areas PDA. Each of the two pad rows PD1 and PD2 includes a plurality of pads arranged along the first direction DR1. The first pad row PD1 is disposed to be spaced apart from the second pad row PD2 in a direction (e.g., the second direction DR2) crossing the first direction DR1. In an embodiment, in the second direction DR2, the second pad row PD2 is spaced apart farther from the edge E-DP of the display panel DP than the first pad row PD1, and is disposed adjacent to the display area DA. However, the present disclosure is not limited thereto, and in another embodiment, the second pad row PD2 may be disposed closer to the edge E-DP of the display panel DP than the first pad row PD1, and spaced apart from the display area DA. The plurality of pads disposed at (e.g., in or on) the first pad row PD1 and the plurality of pads disposed at (e.g., in or on) the second pad row PD2 are respectively connected to the data auxiliary signal lines PL-D.

A gate driving circuit GDC may be integrated on the display panel DP through an oxide silicon gate driver circuit (OSG) process or an amorphous silicon gate driver circuit (ASG) process. The gate auxiliary signal lines PL-G receive a gate signal from the gate driving circuit GDC.

Figure 3:
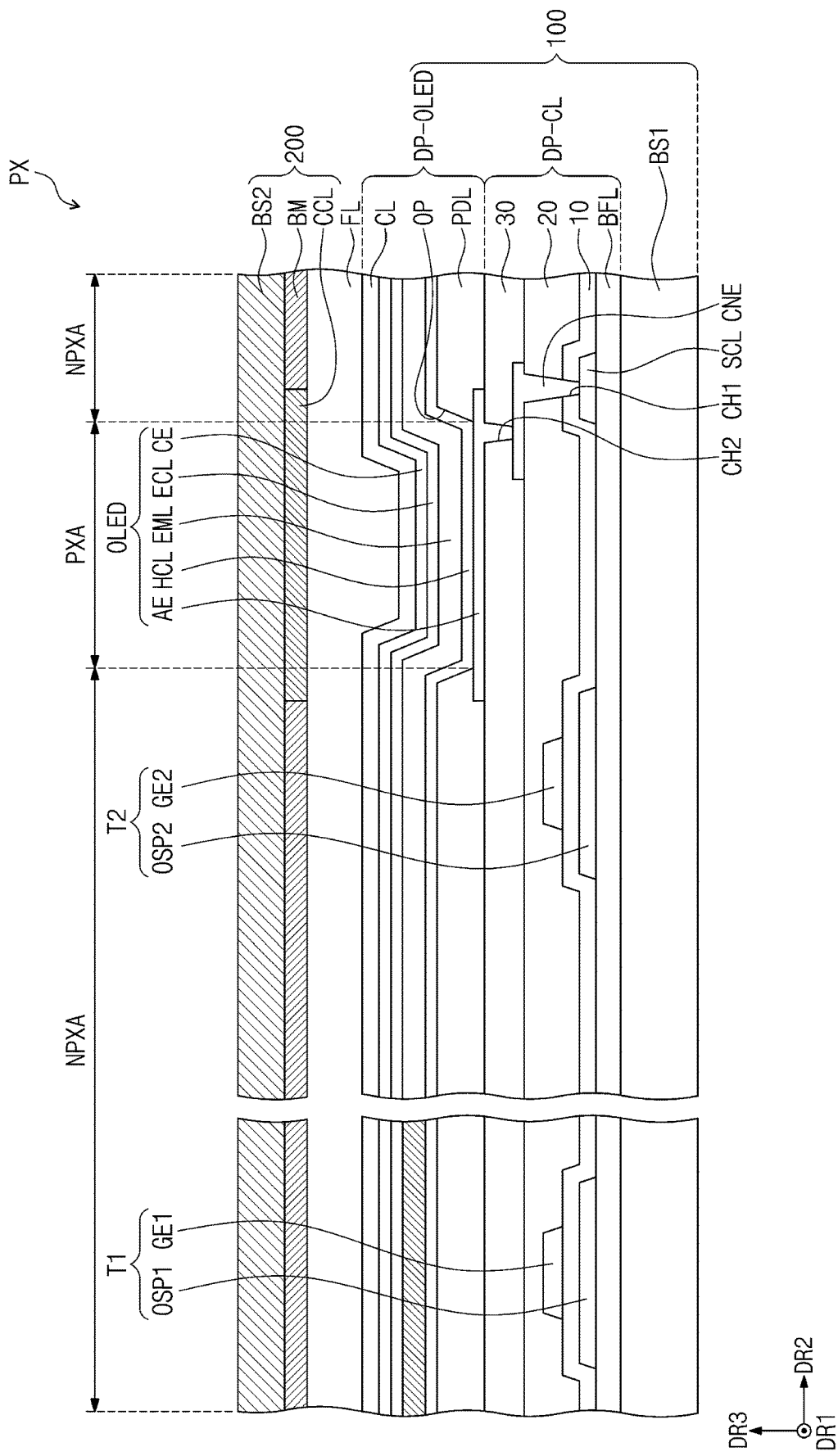
FIG. 3 is a partial cross-sectional view of a display panel according to an embodiment of the present disclosure.

FIG. 3 is a partial cross-sectional view of a display panel according to an embodiment of the present disclosure. In FIG. 3, a cross-section corresponding to a pixel (e.g., to one pixel) PX included in the display panel DP is illustrated.

As described above, the display panel DP may be an organic light emitting display panel. As illustrated in FIG. 3, the pixel PX of the display panel DP may include a switching transistor T1, a driving transistor T2, and a light emitting element OLED.

The display panel DP may include a first substrate 100 and a second substrate 200. In the display panel DP, the first substrate 100 may be referred to as a display substrate, and the second substrate 200 may be referred to as a sealing substrate. The first substrate 100 may include a first base substrate BS1, a circuit element layer DP-CL disposed on the first base substrate BS1, and a display element layer DP-OLED disposed on the circuit element layer DP-CL. The second substrate 200 may include a second base substrate BS2, a black matrix layer BM, and a color conversion layer CCL. The black matrix layer BM and the color conversion layer CCL may be disposed below the second base substrate BS2. However, the present disclosure is not limited thereto, and in an embodiment, at least one of the second base substrate BS2 or the color conversion layer CCL included in the second substrate 200 may be omitted.

The first base substrate BS1 may include a synthetic resin substrate or a glass substrate. The circuit element layer DP-CL includes at least one insulating layer and at least one circuit element. The circuit elements include signal lines, pixel driving circuits, and the like. Each of the insulating layer, a semiconductor layer, and a conductive layer included in the circuit element layer DP-CL may be patterned and formed by a photolithography process.

In the present embodiment, the circuit element layer DP-CL may include a buffer layer BFL, a first insulating layer 10, a second insulating layer 20, and a third insulating layer 30. Each of the first insulating layer 10 and the second insulating layer 20 may be an inorganic layer, and the third insulating layer 30 may be an organic layer. The third insulating layer 30 may be referred to as an intermediate organic layer.

The arrangement relationship between a first semiconductor pattern OSP1, a second semiconductor pattern OSP2, a first control electrode GE1, a second control electrode GE2, a connection signal line SCL, and a connection electrode CNE, which constitute the switching transistor T1 and the driving transistor T2, is illustrated in FIG. 3 by way of an example. A first through hole CH1 is also illustrated in FIG. 3 by way of an example. Although not shown in FIG. 3, each of the first semiconductor pattern OSP1 and the second semiconductor pattern OSP2 may be connected to an input electrode and an output electrode constituting the switching transistor T1 and the driving transistor T2. Although not shown in FIG. 3, the connection signal line SCL may be connected to any suitable one of the transistors constituting the pixel circuit on a plane. In another embodiment, the connection signal line SCL may be omitted, and the connection electrode CNE may be connected to the semiconductor pattern of the transistor through a first through hole CH1.

The display element layer DP-OLED includes a light emitting element OLED. The display element layer DP-OLED may include an organic light emitting diode as the light emitting element OLED. The display element layer DP-OLED includes a pixel defining layer PDL. For example, the pixel defining layer PDL may be an organic layer.

A first electrode AE is disposed on the third insulating layer 30. The first electrode AE is connected to the connection electrode CNE through the second through hole CH2 penetrating the third insulating layer 30. An opening part OP is defined in the pixel defining layer PDL. The opening part OP of the pixel defining layer PDL exposes at least a portion of the first electrode AE. The opening part OP of the pixel defining layer PDL is referred to as a light emitting opening part to distinguish it from other opening parts.

As illustrated in FIG. 3, the display panel DP may include an emission area PXA, and a non-emission area NPXA adjacent to the emission area PXA. The non-emission area NPXA may surround (e.g., around a periphery of) the emission area PXA. In the present embodiment, the emission area PXA is defined to correspond to a partial area of the first electrode AE exposed by the light emission opening part OP.

A hole control layer HCL may be commonly disposed at (e.g., in or on) the emission area PXA and the non-emission area NPXA. The hole control layer HCL may include a hole transport layer, and may further include a hole injection layer. An emission layer EML is disposed on the hole control layer HCL. The emission layer EML may be commonly disposed at (e.g., in or on) the emission area PXA and the non-emission area NPXA. However, the present disclosure is not limited thereto, and the emission layer EML may be patterned to be disposed only at (e.g., in or on) the emission area PXA, and may not be disposed at (e.g., in or on) the non-emission area NPXA. The emission layer EML may include an organic material and/or an inorganic material. The emission layer EML may include a light emitting material that generates a desired first color light (e.g., a predetermined first color light), for example, such as blue light.

An electron control layer ECL is disposed on the emission layer EML. The electron control layer ECL may include an electron transport layer, and may further include an electron injection layer. The electron control layer ECL may be commonly disposed at (e.g., in or on) the emission area PXA and the non-emission area NPXA. The hole control layer HCL and the electron control layer ECL may be commonly formed in the plurality of pixels using an open mask. A second electrode CE is disposed on the electronic control layer ECL. The second electrode CE is commonly disposed in a plurality of pixels. The cover layer CL for protecting the second electrode CE may be disposed on the second electrode CE. The cover layer CL may include an organic material or an inorganic material.

The second base substrate BS2 is disposed to be spaced apart from the cover layer CL. A filling layer FL may be disposed between the second base substrate BS2 and the cover layer CL, and may fill a separated space between the second base substrate BS2 and the cover layer CL. However, the present disclosure is not limited thereto, and in an embodiment, the filling layer FL may be omitted. The second base substrate BS2 may include a synthetic resin substrate or a glass substrate. The color conversion layer CCL may transmit the first color light, or may convert the first color light into a color light having a different wavelength, for example, such as a second color light or a third color light according to the pixel PX. In an embodiment, the second color light may be green light, and the third color light may be red light. The color conversion layer CCL may include a light emitter, for example, such as a quantum dot.

In an embodiment of the present disclosure, a thin film sealing layer may be further disposed on the display element layer DP-OLED of the first substrate 100. The thin film sealing layer may be disposed between the display element layer DP-OLED and the second substrate 200. When the thin film sealing layer is disposed on the display element layer DP-OLED of the first substrate 100, the second base substrate BS2 of the second substrate 200 may be omitted. In this case, the black matrix layer BM and the color conversion layer CCL may be directly disposed on the thin film sealing layer.

Figure 4A:
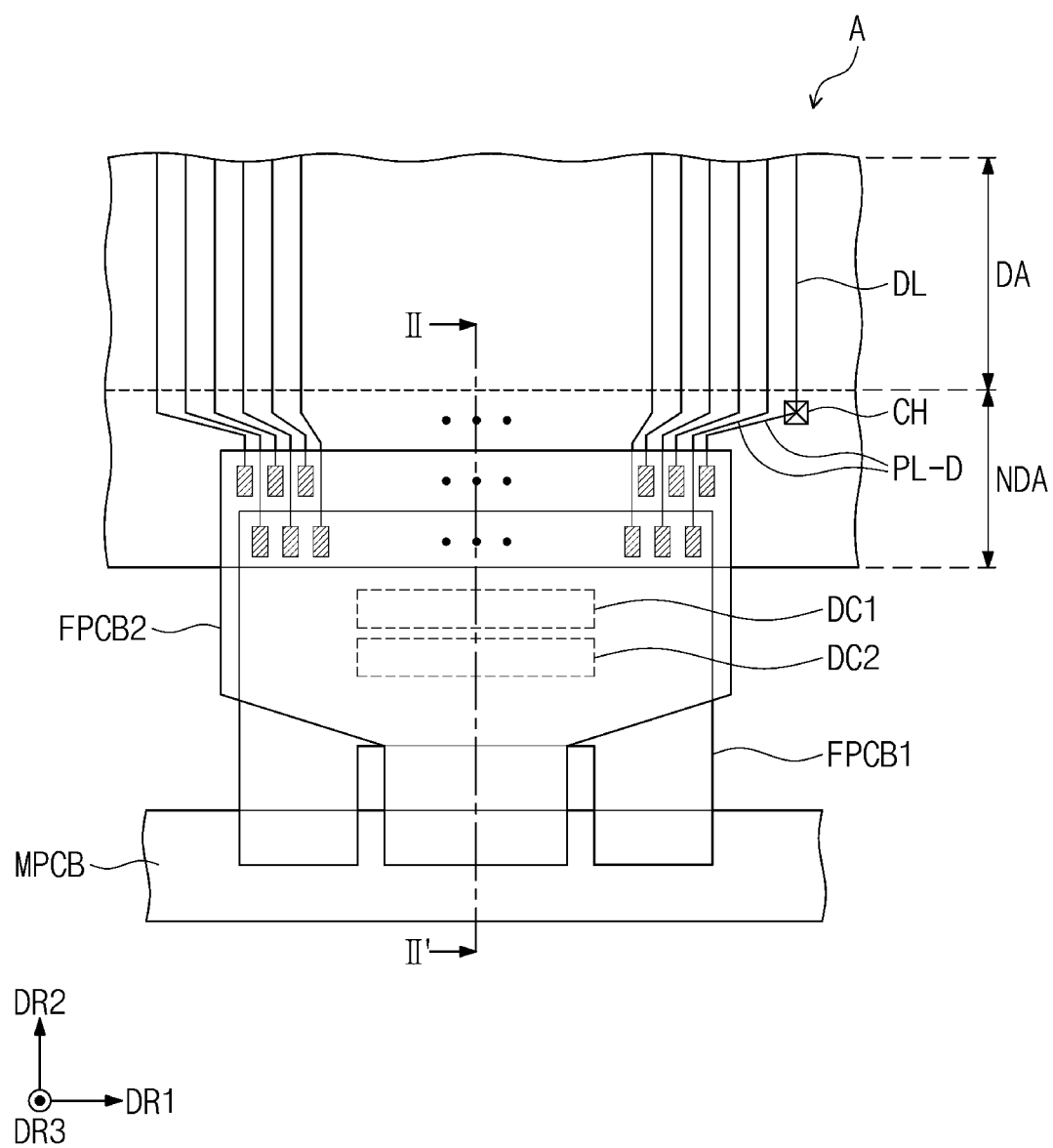
FIG. 4A is an enlarged plan view of a portion of a display device according to an embodiment of the present disclosure.
Figure 4B:
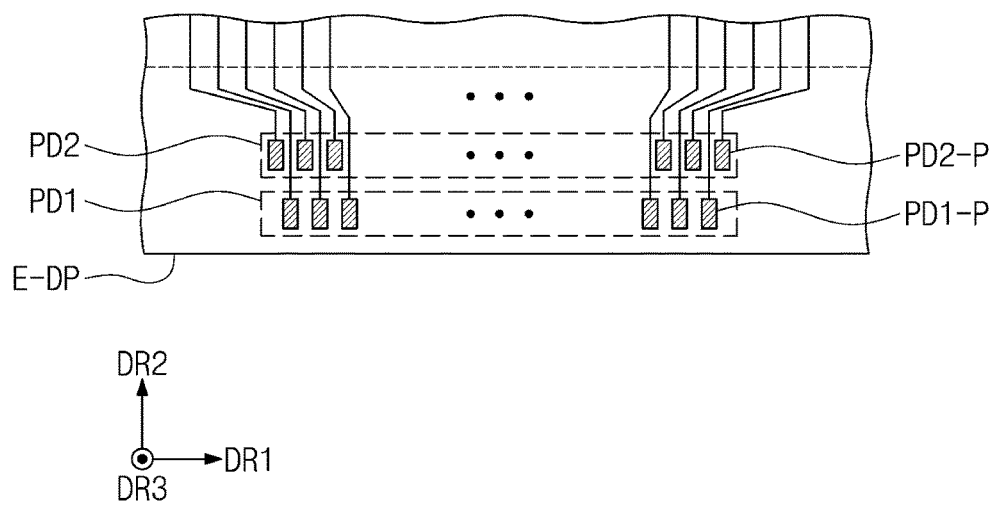
FIG. 4B is an enlarged plan view of a portion of a display panel according to an embodiment of the present disclosure.
Figure 4C:
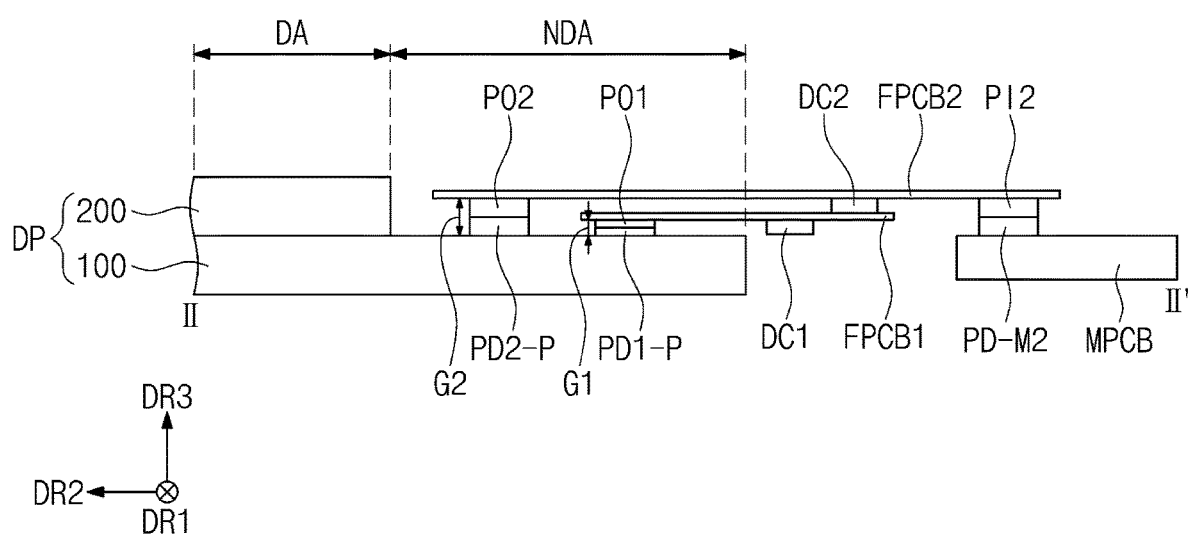
FIG. 4C is a partial cross-sectional view of a display device according to an embodiment of the present disclosure.
Figure 5A:
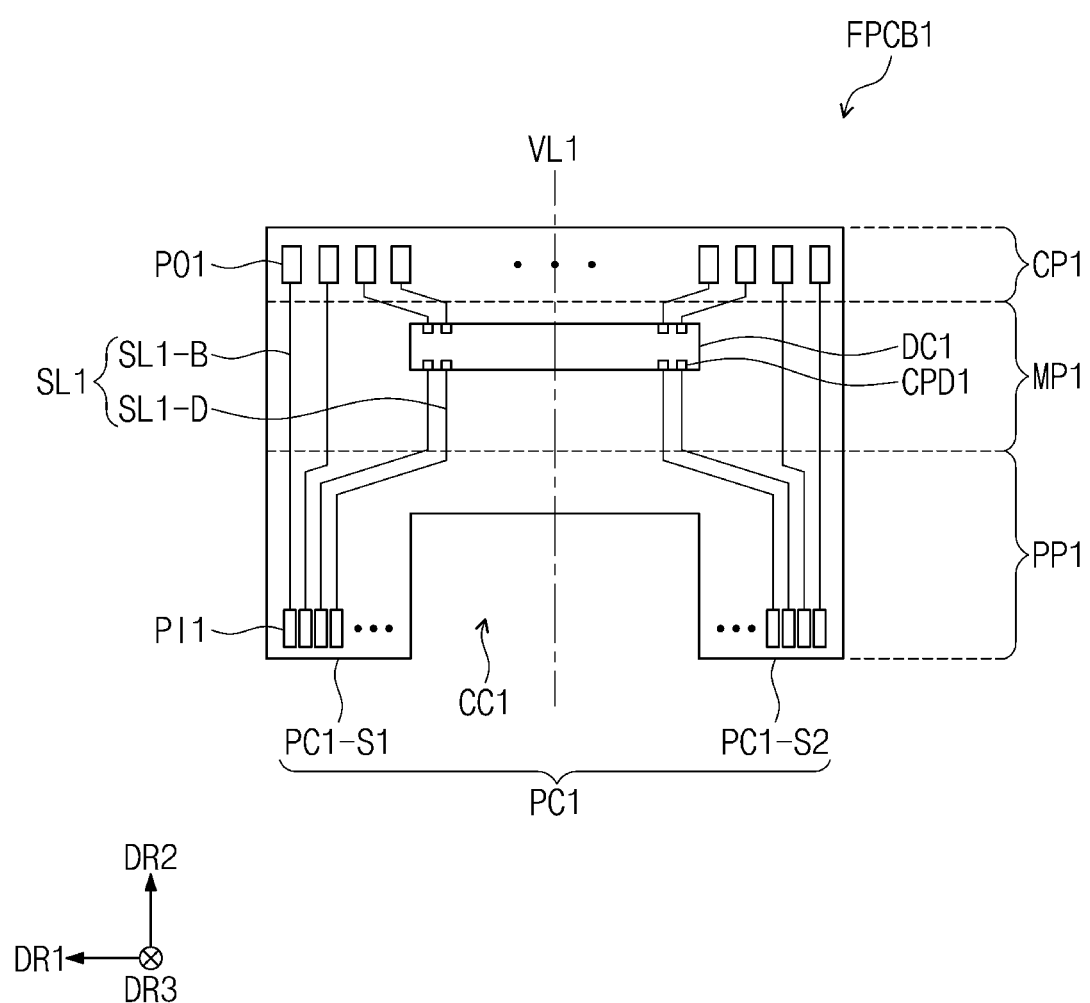
FIG. 5A is a rear view of a first connection circuit board according to an embodiment of the present disclosure.
Figure 5B:
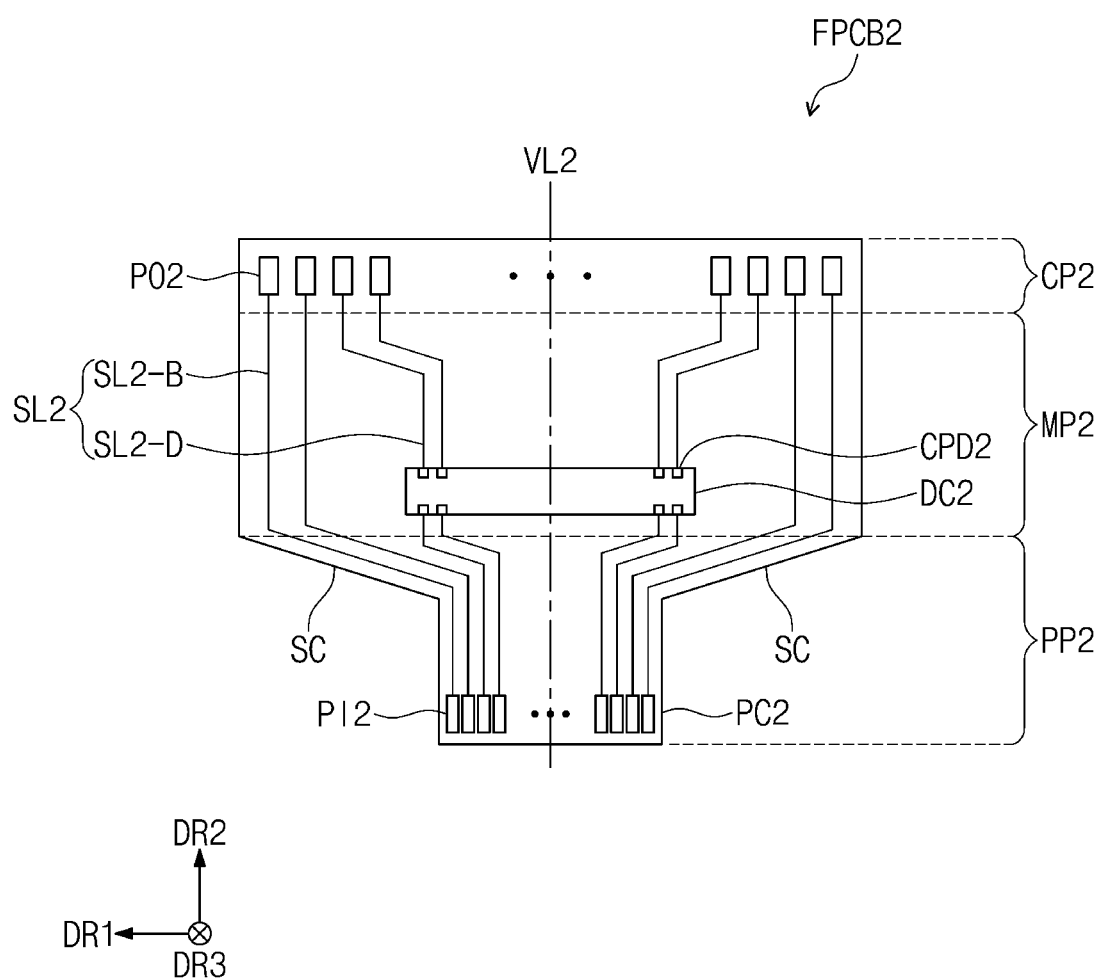
FIG. 5B is a rear view of a second connection circuit board according to an embodiment of the present disclosure.

FIG. 4A is an enlarged plan view of a portion of a display device according to an embodiment of the present disclosure. FIG. 4B is an enlarged plan view of a portion of a display panel according to an embodiment of the present disclosure. FIG. 4C is a partial cross-sectional view of a display device according to an embodiment of the present disclosure. FIG. 5A is a rear view of a first connection circuit board according to an embodiment of the present disclosure. FIG. 5B is a rear view of a second connection circuit board according to an embodiment of the present disclosure. In FIG. 4A, a plan view of a state in which the display panel DP and the connection circuit board FPCB are connected to each other at the area A illustrated in FIG. 2 is illustrated. In FIG. 4B, a pad area to which a connection circuit board is electrically connected in the display panel is illustrated in more detail from among the areas shown in FIG. 4A. In FIG. 4C, a cross-section corresponding to the line II-II' shown in FIG. 4A is shown. Hereinafter, a connection circuit board included in the display device according to an embodiment of the present disclosure will be described in more detail with reference to FIGS. 4A to 5B.

Referring to FIGS. 1A, 4A, and 4B, the first pad row PD1 and the second pad row PD2 disposed at (e.g., in or on) the pad area PDA of the display panel DP and an output pad of the connection circuit board FPCB are electrically connected to each other. The connection circuit board FPCB includes two (e.g., two types of) connection circuit boards FPCB1 and FPCB2. The two connection circuit boards FPCB1 and FPCB2 include the first connection circuit board FPCB1 and the second connection circuit board FPCB2. The first pad row PD1 includes a plurality of first pads PD1-P, and the second pad row PD2 includes a plurality of second pads PD2-P. The first connection circuit board FPCB1 is electrically connected to the plurality of first pads PD1-P, and the second connection circuit board FPCB2 is electrically connected to the plurality of second pads PD2-P. The first pad row PD1 may be disposed to be spaced apart from the second pad row PD2 along the second direction DR2. In the second direction DR2, the second pad row PD2 is spaced apart from the edge E-DP of the display panel DP farther than the first pad row PD1, and is disposed adjacent to the display area DA. For example, the second pad row PD2 is disposed between the first pad row PD1 and the display area DA.

Referring to FIGS. 1A and 4A to 4C, the first connection circuit board FPCB1 and the second connection circuit board FPCB2 are arranged to overlap with each other on a plane, and on a cross-section, the second connection circuit board FPCB2 may be disposed above the first connection circuit board FPCB1. Because the second connection circuit board FPCB2 is disposed above the first connection circuit board FPCB1, a second gap G2 between the first substrate 100 and the second connection circuit board FPCB2 of the display panel DP may be larger than a first gap G1 between the first substrate 100 and the first connection circuit board FPCB1 of the display panel DP. In an embodiment, the first connection circuit board FPCB1 is electrically connected to the first pad PD1-P through a first output pad PO1, and the second connection circuit board FPCB2 is electrically connected to the second pad PD2-P through a second output pad PO2. A sum of the thicknesses of the second output pad PO2 and the second pad PD2-P may be greater than a sum of the thicknesses of the first output pad PO1 and the first pad PD1-P. In some embodiments, a conductive adhesive member, for example, such as the anisotropic conductive film ACF (e.g., see FIG. 1B), may be further disposed between the first output pad PO1 and the first pad PD1-P, and between the second output pad PO2 and the second pad PD2-P. In this case, unlike the embodiment shown in FIG. 4C, the sum of the thicknesses of the second output pad PO2 and the second pad PD2-P and the sum of the thicknesses of the first output pad PO1 and the first pad PD1-P may be the same or substantially the same as each other, and the thickness of the anisotropic conductive film ACF disposed between the second output pad PO2 and the second pad PD2-P may be greater than the thickness of the anisotropic conductive film ACF disposed between the first output pad PO1 and the first pad PD1-P. However, the present disclosure is not limited thereto, and in some embodiments, a separate component for compensating for a difference between the second gap G2 and the first gap G1 may be further disposed between the second output pad PO2 and the second pad PD2-P.

A second input pad PI2 included at (e.g., in or on) the second connection circuit board FPCB2 may be electrically connected to a second substrate pad PD-M2 disposed on the main circuit board MPCB. In some embodiments, a first input pad PI1 (e.g., see FIG. 5A) included at (e.g., in or on) the first connection circuit board FPCB1 may be electrically connected to a first substrate pad disposed on the main circuit board MPCB.

Referring to FIGS. 4A to 4C, 5A, and 5B, the first connection circuit board FPCB1 and the second connection circuit board FPCB2 according to an embodiment includes connection parts CP1 and CP2, and pattern parts PP1 and PP2. The first connection circuit board FPCB1 and the second connection circuit board FPCB2 may further include mounting parts MP1 and MP2 disposed between the connection parts CP1 and CP2 and the pattern parts PP1 and PP2. For example, the first connection circuit board FPCB1 includes a first connection part CP1, a first pattern part PP1, and a first mounting part MP1 disposed between the first connection part CP1 and the first pattern part PP1. The second connection circuit board FPCB2 includes a second connection part CP2, a second pattern part PP2, and a second mounting part MP2 disposed between the second connection part CP2 and the second pattern part PP2.

The first connection circuit board FPCB1 includes the first connection part CP1, and the second connection circuit board FPCB2 includes the second connection part CP2. The first connection part CP1 and the second connection part CP2 are portions electrically connected to the plurality of first pads PD1-P disposed at (e.g., in or on) the first pad row PD1 and the plurality of second pads PD2-P disposed at (e.g., in or on) the second pad row PD2. The first output pad PO1 electrically connected to the first pad PD1-P is disposed at (e.g., in or on) the first connection part CP1, and the second output pad PO2 electrically connected to the second pad PD2-P is disposed at (e.g., in or on) the second connection part CP2.

The first connection circuit board FPCB1 may include the first mounting part MP1, and the second connection circuit board FPCB2 may include the second mounting part MP2. Each of the first mounting part MP1 and the second mounting part MP2 may be a portion on which a driving circuit DC is mounted. A first driving circuit DC1 may be mounted on the first mounting part MP1, and a second driving circuit DC2 may be mounted on the second mounting part MP2. In a state in which each of the first connection circuit board FPCB1 and the second connection circuit board FPCB2 is connected to the display panel DP and the main circuit board MPCB, the first driving circuit DC1 and the second driving circuit DC2 may be disposed so as not to overlap with each other on a plane. In FIG. 4A, it is shown as an example that the first driving circuit DC1 mounted on the first connection circuit board FPCB1 is disposed adjacent to the display panel DP, and the second driving circuit DC2 mounted on the second connection circuit board FPCB2 is disposed to be spaced apart farther from the display panel DP when compared to the first driving circuit DC1. However, the present disclosure is not limited thereto, and the second driving circuit DC2 may be disposed adjacent to the display panel DP to be closer to the display panel DP when compared to the first driving circuit DC1. In some embodiments, the driving circuits such as the first driving circuit DC1 and the second driving circuit DC2 may be mounted on the main circuit board MPCB or the display panel DP, instead of on the first connection circuit board FPCB1 and the second connection circuit board FPCB2.

The first connection circuit board FPCB1 includes the first pattern part PP1, and the second connection circuit board FPCB2 includes the second pattern part PP2. Each of the first pattern part PP1 and the second pattern part PP2 may be a portion that is electrically connected to the main circuit board MPCB.

The first pattern part PP1 of the first connection circuit board FPCB1 includes at least two first protrusion parts PC1 that are spaced apart from each other in the first direction DR1. A first concave part CC1 may be defined at the center of the first connection circuit board FPCB1. The first concave part CC1 may be defined between two of the first protrusion parts PC1 that are spaced apart from each other in the first direction DR1. The first protrusion part PC1 may include a first sub-protrusion part PC1-S1 disposed at the left side of the first connection circuit board FPCB1 based on the first concave part CC1, and a second sub-protrusion part PC1-S2 disposed at the right side of the first connection circuit board FPCB1 based on the first concave part CC1. The first protrusion part PC1 may have a shape protruding in a direction away from the first connection part CP1 connected to the display panel DP along a direction opposite to the second direction DR2. The first protrusion part PC1 may include the first sub-protrusion part PC1-S1 arranged parallel to or substantially parallel to the left side, and the second sub-protrusion part PC1-S2 arranged parallel to or substantially parallel to the right side, based on the short side of the first connection circuit board FPCB1, that is, the side extending along the second direction DR2. The first concave part CC1 may be a portion recessed toward the first connection part CP1 along the second direction DR2 between the first sub-protrusion part PC1-S1 and the second sub-protrusion part PC1-S2, which are spaced apart from each other along the first direction DR1.

A first input pad PI1 may be disposed on the first protrusion part PC1. The first input pad PI1 may be configured to be electrically connected to the main circuit board MPCB. In more detail, the first input pad PI1 may be electrically connected to a first substrate pad disposed on the main circuit board MPCB. A plurality of first input pads PI1 may be provided on the first protrusion part PC1.

The second pattern part PP2 of the second connection circuit board FPCB2 includes a second protrusion part PC2 disposed at the center of the second connection circuit board FPCB2. The second protrusion part PC2 may have a shape protruding in a direction away from the second connection part CP2 connected to the display panel DP along a direction opposite to the second direction DR2 at the center of the second connection circuit board FPCB2. The second pattern part PP2 may further include a hatched portion SC extending in a direction between the first direction DR1 and the second direction DR2 with the second protrusion part PC2 therebetween. The hatched portion SC may be disposed on the left and right sides of the second protrusion part PC2. As the hatched portion SC is formed on the second pattern part PP2, when the second connection circuit board FPCB2 is connected to the main circuit board MPCB, defects due to curling and/or tearing of the second connection circuit board FPCB2 may be prevented or substantially prevented. However, the present disclosure is not limited thereto, and the hatched portion SC may not be included at (e.g., in or on) the second pattern part PP2, and a portion other than the portion in which the second protrusion part PC2 is disposed may have a right angle shape without an inclined shape.

A second input pad PI2 may be disposed on the second protrusion part PC2. The second input pad PI2 may be electrically connected to the main circuit board MPCB. In more detail, the second input pad PI2 may be electrically connected to the second substrate pad PD-M2 disposed on the main circuit board MPCB. A plurality of second input pads PI2 may be provided on the second protrusion part PC2.

The first protrusion part PC1 of the first pattern part PP1 and the second protrusion part PC2 of the second pattern part PP2 may not overlap with each other on a plane. In other words, the second protrusion part PC2 of the second pattern part PP2 overlaps with the portion in which the first concave part CC1 is defined in the first pattern part PP1, and does not overlap with the portion where the first protrusion part PC1 is disposed. In the second pattern part PP2, a separate pattern may not be disposed at (e.g., in or on) a portion overlapping with the first protrusion part PC1 of the first pattern part PP1. The first protrusion part PC1 of the first pattern part PP1 may overlap with a portion of the area where the hatched portion SC is disposed at (e.g., in or on) the second pattern part PP2 on a plane.

The first connection circuit board FPCB1 may further include a plurality of first signal lines SL1. Each of the plurality of first signal lines SL1 may be connected to the first output pad PO1. Each of the plurality of first signal lines SL1 may be connected to at least one of the first output pad PO1 and the first input pad PI1. The plurality of first signal lines SL1 may include a first bypass signal line SL1-B directly connecting the first output pad PO1 and the first input pad PI1 to each other, and a first main signal line SL1-D connecting the first output pad PO1 and the first input pad PI1 to the first driving circuit DC1 through a first connection pad CPD1.

The second connection circuit board FPCB2 may further include a plurality of second signal lines SL2. Each of the plurality of second signal lines SL2 may be connected to the second output pad PO2. Each of the plurality of second signal lines SL2 may be connected to at least one of the second output pad PO2 and the second input pad PI2. The plurality of second signal lines SL2 may include a second bypass signal line SL2-B directly connecting the second output pad PO2 and the second input pad PI2 to each other, and a second main signal line SL2-D connecting the second output pad PO2 and the second input pad PI2 to the second driving circuit DC2 through a second connection pad CPD2.

Each of the first connection circuit board FPCB1 and the second connection circuit board FPCB2 may have a symmetrical shape based on a reference line defined at the center thereof.

In the first connection circuit board FPCB1, a first reference line VL1 is defined extending along the second direction DR2 and defined at the center of the first connection circuit board FPCB1 in the first direction DR1. The first connection circuit board FPCB1 may have a symmetrical shape based on the first reference line VL1. The two first protrusion parts PC1 included in the first pattern part PP1 of the first connection circuit board FPCB1 may have a symmetrical shape based on the first reference line VL1. In other words, the first sub-protrusion part PC1-S1 and the second sub-protrusion part PC1-S2 may have the same or substantially the same separated distance as each other, and the same or substantially the same shape as each other, based on the first reference line VL1. As used in the present specification, "substantially same" refers to values such as intervals and widths of each component that are not only the same as each other, but also the same as each other within a range including differences that may occur due to errors in a process despite the same design. At least one of the first output pad PO1, the first input pad PI1, and the first signal lines SL1 included in the first connection circuit board FPCB1 may be arranged to be symmetrical based on the first reference line VL1.

In the second connection circuit board FPCB2, a second reference line VL2 may be defined extending along the second direction DR2 and defined at the center of the second connection circuit board FPCB2 in the first direction DR1. The second connection circuit board FPCB2 may have a symmetrical shape based on the second reference line VL2. The second protrusion part PC2 included in the second pattern part PP2 of the second connection circuit board FPCB2 may have a symmetrical shape based on the second reference line VL2. The second protrusion part PC2 may have the same or substantially the same width disposed so as to overlap with the second reference line VL2, and extending to the left and right based on the second reference line VL2. At least one of the second output pad PO2, the second input pad PI2, and the second signal lines SL2 included in the second connection circuit board FPCB2 may be arranged to be symmetrical based on the second reference line VL2.

In the display device according to an embodiment of the present disclosure, in relation to each of the first connection circuit board FPCB1 and the second connection circuit board FPCB2, the protruding patterns of the first pattern part PP1 and the second pattern part PP2 connected to the main circuit board MPCB are arranged so as to not overlap with each other on the plane, and based on a reference line defined at the center of each of the first connection circuit board FPCB1 and the second connection circuit board FPCB2, the first connection circuit board FPCB1 and the second connection circuit board FPCB2 may have a symmetrical shape. As each of the first connection circuit board FPCB1 and the second connection circuit board FPCB2 is designed symmetrically, an inefficient area may be reduced where it may be difficult to arrange wiring and/or the like in a connection circuit board having an asymmetric shape, and input/output pads and signal lines included in each of the first connection circuit board FPCB1 and the second connection circuit board FPCB2 may also be designed to be symmetrically arranged, so that wiring connection efficiency of the connection circuit board may be increased. In addition, the occurrence of defects, for example, such as curling and/or tearing, due to heat in the inefficient area of a connection circuit board having an asymmetric shape may be minimized or reduced, so that the reliability of the connection circuit board may be improved. Accordingly, display efficiency and durability of a display device including the first connection circuit board FPCB1 and the second connection circuit board FPCB2 may be improved.

Figure 6A:
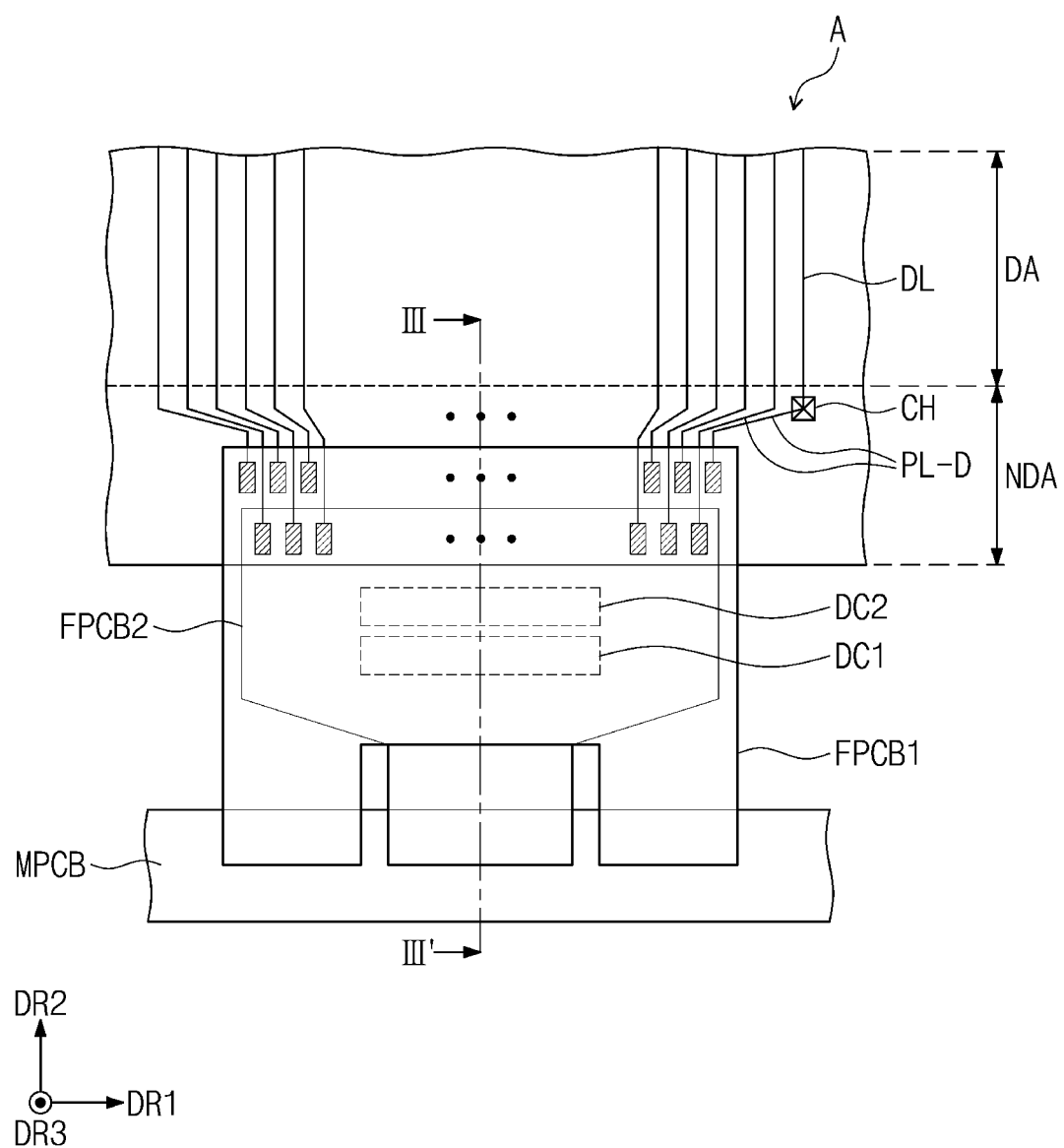
FIG. 6A is an enlarged plan view of a portion of a display device according to an embodiment of the present disclosure.
Figure 6B:
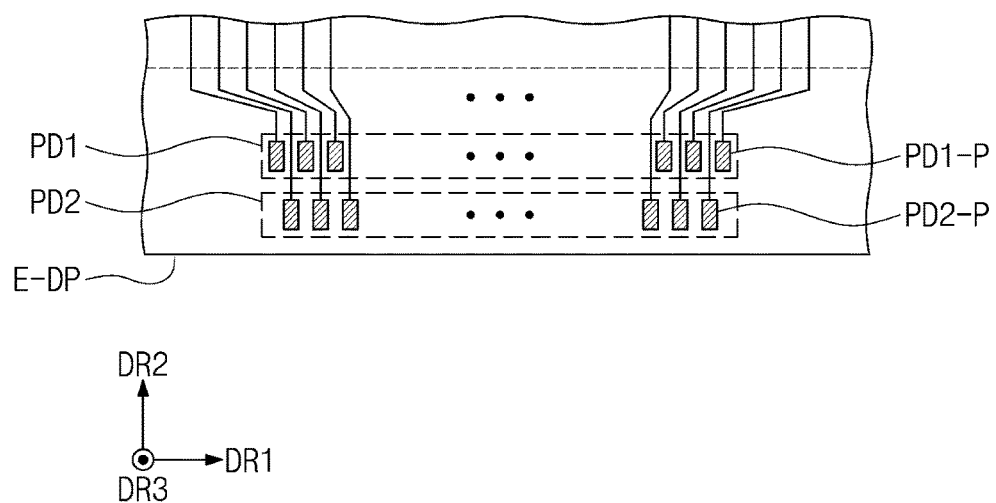
FIG. 6B is an enlarged plan view of a portion of a display panel according to an embodiment of the present disclosure.
Figure 6C:
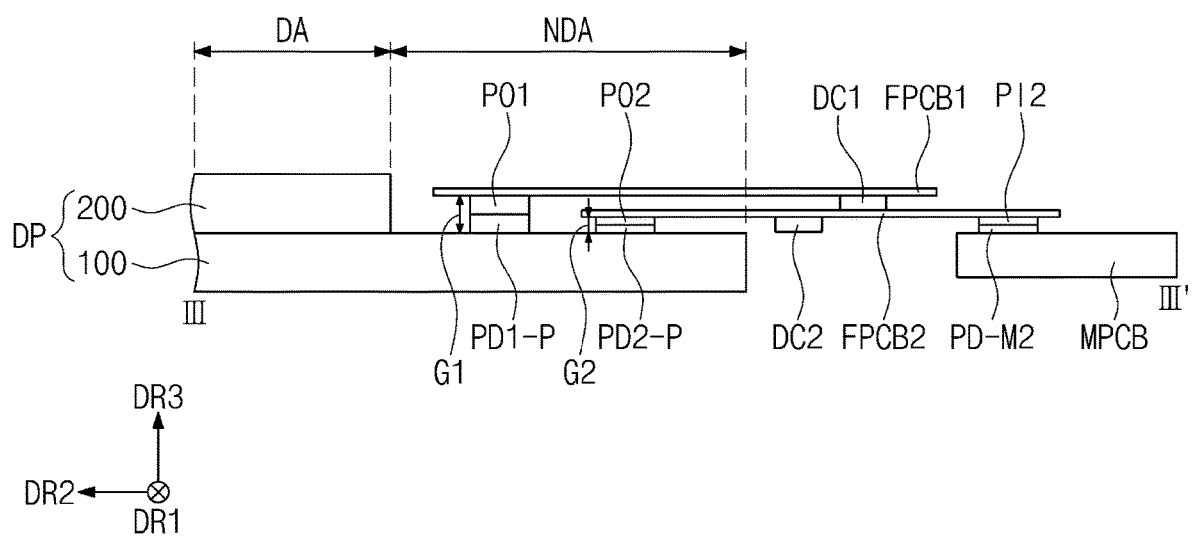
FIG. 6C is a partial cross-sectional view of a display device according to an embodiment of the present disclosure.

FIG. 6A is an enlarged plan view of a portion of a display device according to another embodiment of the present disclosure. FIG. 6B is an enlarged plan view of a portion of a display panel according to another embodiment of the present disclosure. FIG. 6C is a partial cross-sectional view of a display device according to another embodiment of the present disclosure. FIG. 6A illustrates an enlarged view of a portion of the display device where the display panel and the main circuit board are connected to each other by a connection circuit board. FIG. 6B illustrates a pad area to which the connection circuit board is electrically connected in the display panel. FIG. 6C is a cross-section corresponding to the line III-III' shown in FIG. 6A. Hereinafter, in describing the connection circuit board included in the display device according to an embodiment of the present disclosure with reference to FIGS. 6A to 6C, the same reference numerals are assigned to the same or substantially the same components as those described above, and thus, redundant description thereof may not be repeated.

Referring to FIGS. 5A, 5B, and 6A to 6C, the first connection circuit board FPCB1 and the second connection circuit board FPCB2 are arranged to overlap with each other on a plane, and in the cross-section, the first connection circuit board FPCB1 may be disposed above the second connection circuit board FPCB2. In other words, as shown in FIG. 5A, the first connection circuit board FPCB1 including the two first protrusion parts PC1 and defining the first concave part CC1 between the two first protrusion parts PC1 is disposed on the upper side, and as shown in FIG. 5B, the second connection circuit board FPCB2 including the second protrusion part PC2 disposed at the center may be disposed on the lower side. In the display device according to an embodiment of the present disclosure, as in the embodiment shown in FIGS. 4A to 4C, the first connection circuit board FPCB1 may be disposed on the lower side and the second connection circuit board FPCB2 may be disposed on the upper side, and as in the embodiment shown in FIGS. 6A to 6C, the second connection circuit board FPCB2 may be disposed on the lower side and the first connection circuit board FPCB1 may be disposed on the upper side.

Referring again to FIGS. 5A, 5B, and 6A to 6C, in order to be connected with the first connection circuit board FPCB1 disposed on the upper side, the first pad row PD1 including the plurality of first pads PD1-P is disposed to be spaced apart from the edge E-DP of the display panel DP farther than the second pad row PD2, and may be disposed adjacent to the display area DA. In addition, in order to be connected to the second connection circuit board FPCB2 disposed on the lower side, the second pad row PD2 including the plurality of second pads PD2-P is disposed to be farther spaced apart from the display area DA of the display panel DP than the first pad row PD1, and may be disposed adjacent to the edge E-DP.

Because the first connection circuit board FPCB1 is disposed above the second connection circuit board FPCB2, the first gap G1 between the first substrate 100 and the first connection circuit board FPCB1 of the display panel DP may be larger than the second gap G2 between the first substrate 100 and the second connection circuit board FPCB2 of the display panel DP. In an embodiment, the first connection circuit board FPCB1 is electrically connected to the first pad PD1-P through the first output pad PO1, and the second connection circuit board FPCB2 is electrically connected to the second pad PD2-P through the second output pad PO2. The sum of the thicknesses of the first output pad PO1 and the first pad PD1-P may be greater than the sum of the thicknesses of the second output pad PO2 and the second pad PD2-P. In some embodiments, a conductive adhesive member, for example, such as the anisotropic conductive film ACF (e.g., see FIG. 1B), may be further disposed between the first output pad PO1 and the first pad PD1-P, and between the second output pad PO2 and the second pad PD2-P. In this case, unlike the embodiment shown in FIG. 6C, the sum of the thicknesses of the first output pad PO1 and the first pad PD1-P and the sum of the thicknesses of the second output pad PO2 and the second pad PD2-P may be the same or substantially the same as each other, and the thickness of the anisotropic conductive film ACF disposed between the first output pad PO1 and the first pad PD1-P may be larger than the thickness of the anisotropic conductive film ACF disposed between the second output pad PO2 and the second pad PD2-P. However, the present disclosure is not limited thereto, and in some embodiments, a separate component for compensating for a difference between the second gap G2 and the first gap G1 may be further disposed between the first output pad PO1 and the first pad PD1-P.

The second input pad PI2 included in the second connection circuit board FPCB2 may be electrically connected to the second substrate pad PD-M2 disposed on the main circuit board MPCB. In some embodiments, the first input pad PI1 included in the first connection circuit board FPCB1 may be electrically connected to the first substrate pad disposed on the main circuit board MPCB.

Figure 7A:
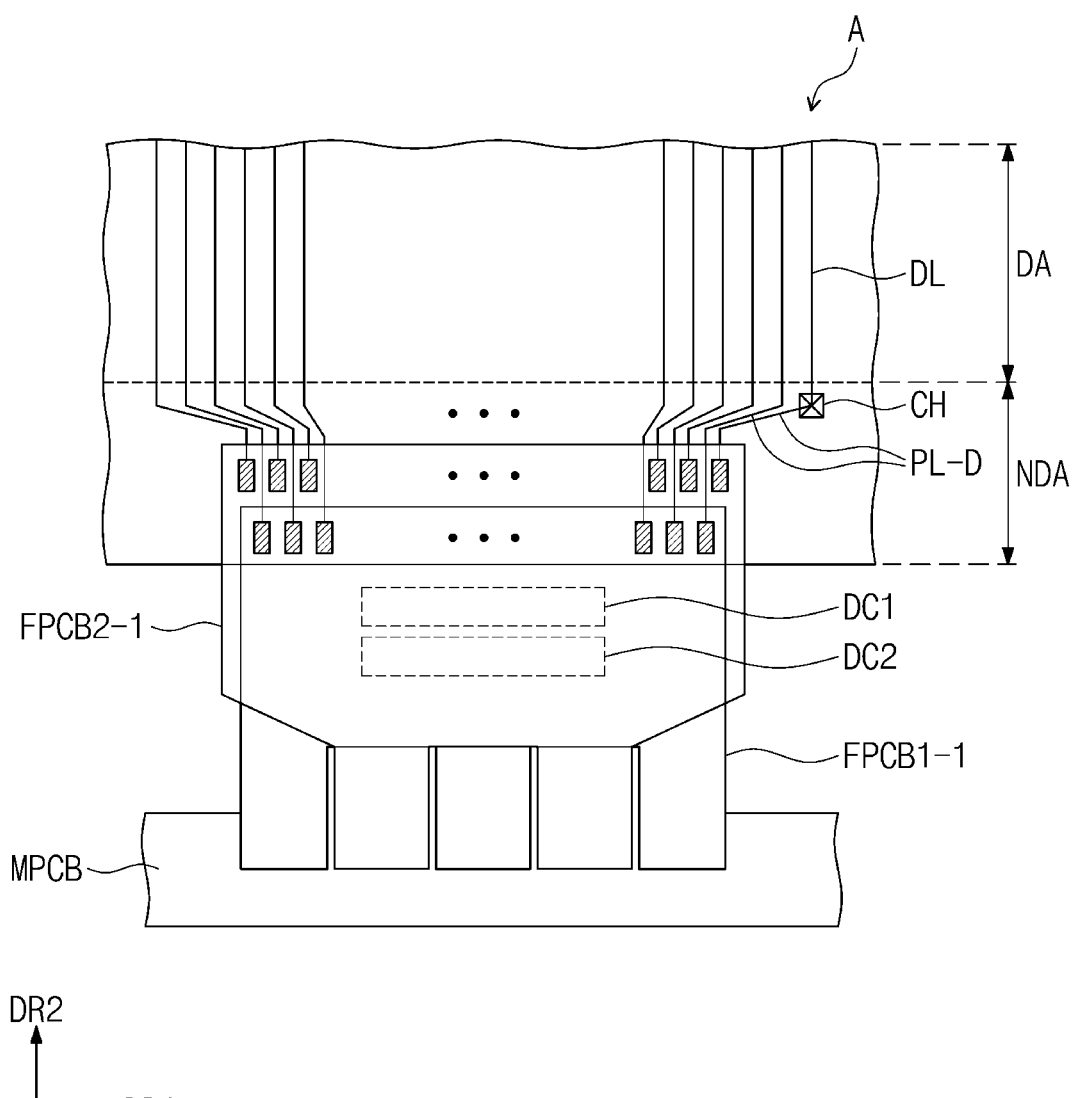
FIG. 7A is an enlarged plan view of a portion of a display device according to an embodiment of the present disclosure.
Figure 7B:
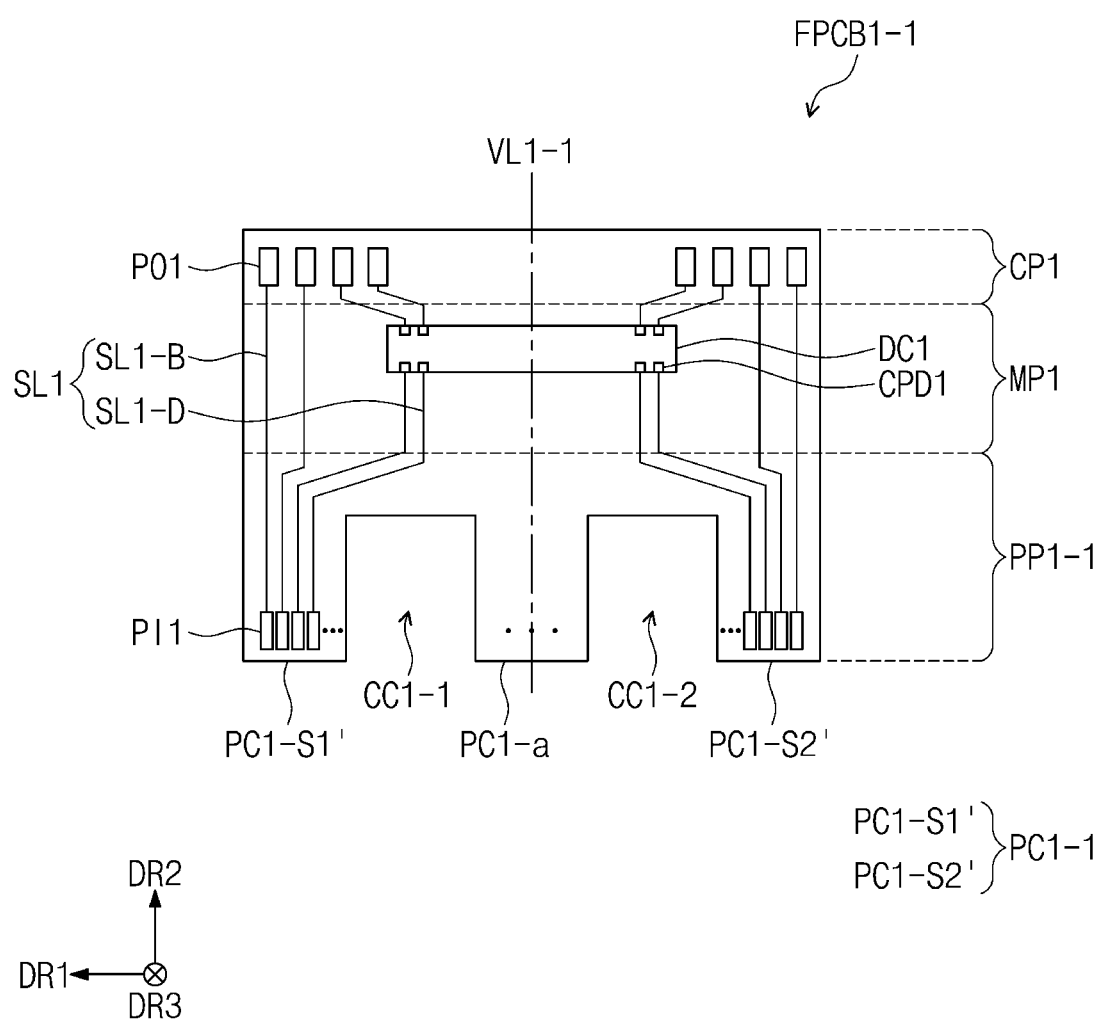
FIG. 7B is a rear view of a first connection circuit board according to an embodiment of the present disclosure.
Figure 7C:
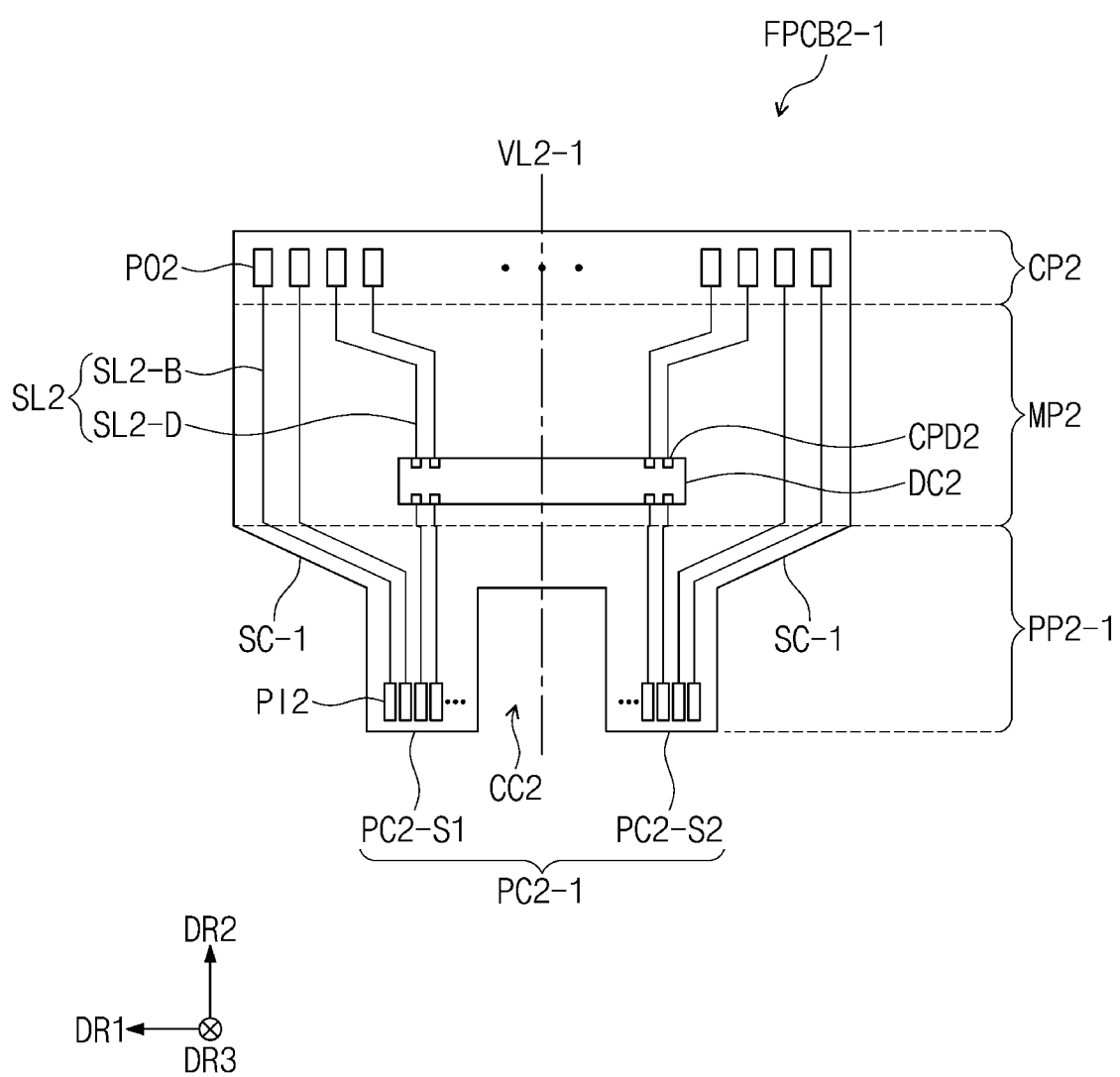
FIG. 7C is a rear view of a second connection circuit board according to an embodiment of the present disclosure.

FIG. 7A is an enlarged plan view of a portion of a display device according to another embodiment of the present disclosure. FIG. 7B is a rear view of a first connection circuit board according to another embodiment of the present disclosure. FIG. 7C is a rear view of a second connection circuit board according to another embodiment of the present disclosure. Hereinafter, in describing the connection circuit board included in the display device according to an embodiment of the present disclosure with reference to FIGS. 7A to 7C, the same reference numerals are assigned to the same or substantially the same components as those described above, and thus, redundant description thereof may not be repeated.

Referring to FIGS. 7A to 7C, the first connection circuit board FPCB1-1 and the second connection circuit board FPCB2-1 according to an embodiment are arranged to overlap with each other on a plane. The first connection circuit board FPCB1-1 and the second connection circuit board FPCB2-1 include connection parts CP1 and CP2, and pattern parts PP1-1 and PP2-1. The first connection circuit board FPCB1-1 and the second connection circuit board FPCB2-1 may further include mounting parts MP1 and MP2 disposed between the connection parts CP1 and CP2 and the pattern parts PP1-1 and PP2-1. For example, the first connection circuit board FPCB1-1 includes a first connection part CP1, a first pattern part PP1-1, and a first mounting part MP1 disposed between the first connection part CP1 and the first pattern part PP1-1. The second connection circuit board FPCB2-1 includes a second connection part CP2, a second pattern part PP2-1, and a second mounting part MP2 disposed between the second connection part CP2 and the second pattern part PP2-1. FIG. 7A illustrates that the second connection circuit board FPCB2-1 is disposed above the first connection circuit board FPCB1-1, but the present disclosure is not limited thereto, and in other embodiments, the first connection circuit board FPCB1-1 may be disposed above the second connection circuit board FPCB2-1.

The first connection circuit board FPCB1-1 according to an embodiment includes the first pattern part PP1-1, and the first pattern part PP1-1 may include at least two first protrusion parts PC1-1. In the first pattern part PP1-1, the concave part CC1 (e.g., see FIG. 5A) may be defined between the two first protrusion parts PC1-1, which may include a first sub-protrusion part PC1-S1' and a second sub-protrusion part PC1-S2'. The first pattern part PP1-1 may include at least one first additional protrusion part PC1-a arranged in the concave part CC1 (e.g., see FIG. 5A). The first additional protrusion part PC1-a may be disposed between the first sub-protrusion part PC1-S1' and the second sub-protrusion part PC1-S2', and may be spaced apart from each of the first sub-protrusion part PC1-S1' and the second sub-protrusion part PC1-S2' along the first direction DR1. As the first additional protrusion part PC1-a is disposed, at least one first sub-opening part CC1-1 may be defined between the first additional protrusion part PC1-a and the first sub-protrusion part PC1-S1', and at least one second sub-opening part CC1-2 may be defined between the first additional protrusion part PC1-a and the second sub-protrusion part PC1-S2'. FIG. 7B illustrates that one first additional protrusion part PC1-a is arranged as an example, but the present disclosure is not limited thereto, and a plurality of first additional protrusion parts PC1-a may be arranged. At least one of the first additional protrusion parts PC1-a may overlap with a first reference line VL1-1. The first sub-protrusion part PC1-S1' and the second sub-protrusion part PC1-S2' may be symmetrically arranged based on the first reference line VL1-1, and may have a symmetrical shape. The first additional protrusion part PC1-a may be symmetrically disposed based on the first reference line VL1-1, and may have a symmetrical shape. The first input pad PI1 electrically connected to the main circuit board MPCB may be disposed at (e.g., in or on) each of the first sub-protrusion part PC1-S1', the second sub-protrusion part PC1-S2', and the first additional protrusion part PC1-a.

The second connection circuit board FPCB2-1 according to an embodiment includes the second pattern part PP2-1, and in the second pattern part PP2-1, a plurality of second protrusion parts PC2-1 may be provided. The second protrusion part PC2-1 may include a third sub-protrusion part PC2-S1 and a fourth sub-protrusion part PC2-S2 spaced apart from each other along the first direction DR1. A second concave part CC2 may be defined between the plurality of second protrusion parts PC2-1. In an embodiment, the second concave part CC2 may be defined between the third sub-protrusion part PC2-S1 and the fourth sub-protrusion part PC2-S2 that are spaced apart from each other along the first direction DR1. The second concave part CC2 may be a portion recessed toward the second connection part CP2 along the second direction DR2 between the third sub-protrusion part PC2-S1 and the fourth sub-protrusion part PC2-S2 that are spaced apart from each other along the first direction DR1. FIG. 7C illustratively shows that the second protrusion part PC2-1 includes the third sub-protrusion part PC2-S1 and the fourth sub-protrusion part PC2-S2, that is, two protrusion parts, but the present disclosure is not limited thereto, and the second protrusion part PC2-1 may include three or more protrusion parts. When the second protrusion part PC2-1 includes three or more protrusion parts, the second concave part CC2 may be defined as a plurality. The second concave part CC2 may overlap with a second reference line VL2-1. The third sub-protrusion part PC2-S1 and the fourth sub-protrusion part PC2-S2 may be symmetrically disposed based on the second reference line VL2-1, and may have a symmetrical shape. A hatched portion SC-1 may be disposed on the left side of the third sub-protrusion part PC2-S1 and on the right side of the fourth sub-protrusion part PC2-S2. The second input pad PI2 electrically connected to the main circuit board MPCB may be disposed at (e.g., in or on) each of the third sub-protrusion part PC2-S1 and the fourth sub-protrusion part PC2-S2.

The first protrusion part PC1-1 of the first pattern part PP1-1 and the second protrusion part PC2-1 of the second pattern part PP2-1 may not overlap with each other on a plane. In addition, the first additional protrusion part PC1-a of the first pattern part PP1-1 and the second protrusion part PC2-1 may not overlap with each other on a plane. In other words, the third sub-protrusion part PC2-S1 of the second protrusion part PC2-1 of the second pattern part PP2-1 overlaps with a portion where the first sub opening part CC1-1 is defined, and the fourth sub-protrusion part PC2-S2 overlaps with a portion where the second sub opening part CC1-2 is defined, so that a portion in which the first protrusion part PC1-1 and the first additional protrusion part PC1-a are disposed may not overlap with a portion where the second protrusion part PC2-1 is disposed. The first additional protrusion part PC1-a may be disposed to overlap with the second concave part CC2 defined between the third sub-protrusion part PC2-S1 and the fourth sub-protrusion part PC2-S2. In the second pattern part PP2-1, a separate pattern may not be disposed in a portion overlapping with the first protrusion part PC1-1 of the first pattern part PP1-1. The first protrusion part PC1-1 of the first pattern part PP1-1 may overlap with a portion of the area where the hatched portion SC-1 is disposed in the second pattern part PP2-1 on a plane. In the display device according to an embodiment of the present disclosure, even if a plurality of first additional protrusion parts PC1-a are further included in the first pattern part PP1-1 of the first connection circuit board FPCB1-1, and a plurality of second protrusion parts PC2-1 included in the second pattern part PP2-1 of the second connection circuit board FPCB2-1 are provided, the protruding patterns of the first pattern part PP1-1 and the second pattern part PP2-1 are arranged to not overlap with each other on a plane, and the first connection circuit board FPCB1-1 and the second connection circuit board FPCB2-1 may have a symmetrical shape based on the reference line defined at the center of each of the first connection circuit board FPCB1-1 and the second connection circuit board FPCB2-1. Accordingly, an inefficient area where wiring or the like is difficult to be arranged may be minimized or reduced, and display efficiency and durability of a display device including the first connection circuit board FPCB1-1 and the second connection circuit board FPCB2-1 may be improved.

According to an embodiment of the present disclosure, two (e.g., two types of) connection circuit boards may be applied to high-resolution display devices, and each of the two connection circuit boards is designed symmetrically, so that inefficient areas may be minimized or reduced, and defects, for example, such as curling and/or tearing, may be prevented or substantially prevented from occurring in the connection circuit boards. Accordingly, display efficiency and durability of a display device including the connection circuit boards according to one or more embodiments of the present disclosure may be improved.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
   a display panel comprising first pads arranged along a first direction, and second pads spaced apart from the first pads;
   a first connection circuit board electrically connected to the first pads; and
   a second connection circuit board electrically connected to the second pads, wherein the first connection circuit board comprises:
      first output pads electrically connected to the first pads, the first output pads being located at a first end of the first connection circuit board; and
      at least two first protrusion parts spaced along the first direction and defining at least two free ends protruding away from the first end of the first connection circuit board in a second direction crossing the first direction, the at least two free ends comprising first input pads to be electrically connected to a main circuit board, and
   wherein the second connection circuit board comprises:
      second output pads electrically connected to the second pads; and
      at least one second protrusion part protruding in the second direction, and located between the first protrusion parts when viewed on a plane that is parallel to a surface of the display panel, the at least one second protrusion part comprising second input pads to be electrically connected to the main circuit board between the first input pads of the at least two free ends.

2. The display device of claim 1, further comprising the main circuit board electrically connected to the first input pads of the first connection circuit board and the second input pads of the second connection circuit board.

3. The display device of claim 1, wherein the first protrusion parts do not overlap with the second protrusion part when viewed on the plane.

4. The display device of claim 1, wherein the first protrusion parts are symmetrical to each other relative to a first reference line extending through a center of the first connection circuit board in a direction perpendicular to the first direction.

5. The display device of claim 4, wherein the first connection circuit board further comprises a plurality of first signal lines electrically connected to the first output pads, and wherein the plurality of first signal lines have a symmetrical shape relative to the first reference line.

6. The display device of claim 1, wherein the second protrusion part has a symmetrical shape relative to a second reference line extending through a center of the second connection circuit board in a direction perpendicular to the first direction.

7. The display device of claim 6, wherein the second connection circuit board further comprises a plurality of second signal lines electrically connected to the second output pads, and wherein the plurality of second signal lines have a symmetrical shape relative to the second reference line.

8. The display device of claim 1, wherein the second connection circuit board further comprises a hatched portion extending in a direction between the first direction and the second direction with the second protrusion part therebetween.

9. The display device of claim 1, wherein the first connection circuit board further comprises at least one first additional protrusion part between the first protrusion parts and spaced apart from the first protrusion parts along the first direction.

10. The display device of claim 1, wherein the second protrusion part comprises a plurality of second protrusion parts, and wherein at least one second concave part is defined between the plurality of second protrusion parts in the second connection circuit board.

11. The display device of claim 1, wherein the first connection circuit board is on the second connection circuit board.

12. The display device of claim 1, wherein the second connection circuit board is on the first connection circuit board.

13. The display device of claim 1, wherein a first concave part is defined between the first protrusion parts, wherein the first protrusion parts comprise a first sub-protrusion part and a second sub-protrusion part spaced apart from the first sub-protrusion part along the first direction with the first concave part therebetween, and wherein the first sub-protrusion part and the second sub-protrusion part have the same shape as each other.

14. The display device of claim 1, wherein the first connection circuit board further comprises a first driving circuit between the first output pads and the first protrusion parts, and wherein the second connection circuit board further comprises a second driving circuit between the second output pads and the second protrusion part.

15. The display device of claim 14, wherein the first driving circuit and the second driving circuit do not overlap with each other when viewed on the plane.

16. A display device comprising:
a display panel comprising first pads and second pads;
a first connection circuit board electrically connected to the first pads; and
a second connection circuit board electrically connected to the second pads,
wherein the first connection circuit board comprises:
a first connection part electrically connected to the first pads, the first connection part being located at a first end of the first connection circuit board; and
a first pattern part defining at least two first protrusion parts that are spaced apart along a first direction, the at least two first protrusion parts defining at least two free ends protruding away from the first end of the first connection circuit board along a second direction crossing the first direction, the at least two free ends comprising first input pads to be electrically connected to a main circuit board,
wherein the second connection circuit board comprises:
a second connection part electrically connected to the second pads; and
a second pattern part protruding along the second direction, and defining at least one second protrusion part that does not overlap with the first protrusion parts when viewed on a plane that is parallel to a surface of the display panel, the at least one second protrusion part comprising second input pads to be electrically connected to the main circuit board between the first input pads of the at least two free ends,
wherein the first protrusion parts have a symmetrical shape relative to a first reference line extending through a center of the first connection circuit board in a direction perpendicular to the first direction, and
wherein the second protrusion part has a symmetrical shape relative to a second reference line extending through a center of the second connection circuit board in a direction perpendicular to the first direction.

17. The display device of claim 16, wherein a first concave part is defined between the first protrusion parts in the first pattern part, and wherein the second protrusion part overlaps with the first concave part when viewed on the plane.

18. The display device of claim 16, further comprising the main circuit board electrically connected to the first input pads of the first connection circuit board and the second input pads of the second connection circuit board.

19. The display device of claim 16, wherein the first protrusion parts comprise a first sub-protrusion part and a second sub-protrusion part spaced apart from the first sub-protrusion part along the first direction with a first concave part therebetween, and wherein the first sub-protrusion part and the second sub-protrusion part are symmetrical to each other relative to the first reference line.

* * * * *